United States Patent
Chan et al.

(10) Patent No.: US 7,067,391 B2
(45) Date of Patent: Jun. 27, 2006

(54) METHOD TO FORM A METAL SILICIDE GATE DEVICE

(75) Inventors: Bor-Wen Chan, Hsin-Chu (TW);
Chih-Hao Wang, Hsin-Chu (TW);
Lawrance Hsu, Hsin-Chu (TW);
Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 10/780,513

(22) Filed: Feb. 17, 2004

(65) Prior Publication Data

US 2005/0179098 A1  Aug. 18, 2005

(51) Int. Cl.
*H01L 21/28* (2006.01)
*H01L 21/4763* (2006.01)
*H01L 21/44* (2006.01)
*H01L 21/302* (2006.01)

(52) U.S. Cl. ............... 438/446; 438/581; 438/583; 438/630; 438/647; 438/649; 438/651; 438/655; 438/664; 438/682; 438/684; 438/721; 438/755

(58) Field of Classification Search ........... 438/189, 438/230, 265, 303, 366, 446, 595, 97, 361, 438/365, 368, 498, 488, 532, 564, 647, 657, 438/689, 764
See application file for complete search history.

(56) References Cited

U.S. PATENT DOCUMENTS

| | | | | |
|---|---|---|---|---|
| 5,943,596 A | * | 8/1999 | Gardner et al. | 438/585 |
| 6,136,675 A | * | 10/2000 | Lee | 438/585 |
| 6,423,634 B1 | * | 7/2002 | Wieczorek et al. | 438/655 |
| 6,465,309 B1 | | 10/2002 | Xiang et al. | 438/299 |
| 6,475,908 B1 | | 11/2002 | Lin et al. | 438/659 |
| 6,518,755 B1 | * | 2/2003 | Edwards | 324/303 |
| 6,528,402 B1 | | 3/2003 | Tseng | 438/592 |
| 6,753,215 B1 | * | 6/2004 | Kasuya | 438/197 |
| 6,806,534 B1 | * | 10/2004 | Dokumaci et al. | 257/330 |
| 6,908,850 B1 | * | 6/2005 | Doris et al. | 438/630 |
| 2002/0084476 A1 | * | 7/2002 | Kasuya | 257/262 |
| 2005/0054164 A1 | * | 3/2005 | Xiang | 438/285 |
| 2005/0118531 A1 | * | 6/2005 | Lee et al. | 430/311 |
| 2005/0156238 A1 | * | 7/2005 | Wen et al. | 257/347 |

* cited by examiner

*Primary Examiner*—Carl Whitehead, Jr.
*Assistant Examiner*—James M. Mitchell
(74) *Attorney, Agent, or Firm*—Haynes and Boone, LLP

(57) ABSTRACT

A new method to form metal silicide gates in the fabrication of an integrated circuit device is achieved. The method comprises forming polysilicon lines overlying a substrate with a dielectric layer therebetween. A first isolation layer is formed overlying the substrate and the sidewalls of the polysilicon lines. The first isolation layer does not overlie the top surface of the polysilicon lines. The polysilicon lines are partially etched down such that the top surfaces of the polysilicon lines are below the top surface of the first isolation layer. A metal layer is deposited overlying the polysilicon lines. A thermal anneal is used to completely convert the polysilicon lines to metal silicide gates. The unreacted metal layer is removed to complete the device.

18 Claims, 8 Drawing Sheets

METHOD TO FORM A METAL SILICIDE GATE DEVICE

BACKGROUND OF THE INVENTION (1) Field of the Invention

The invention relates to integrated circuit manufacturing, and, more particularly, to a method to fabricate a metal silicide gate device in the manufacture of an integrated circuit device.

(2) Description of the Prior Art

Metal-oxide-semiconductor (MOS) devices are commonly used in the art of integrated circuits. MOS devices offer many advantages over, for example, bipolar devices, such as the ability to form millions of such devices on the surface of the integrated circuit and the very low gate current of these devices. In a typical, high density MOS product, the gate terminal is fabricated using polysilicon. This choice provides many benefits from a manufacturing and device standpoint. However, as device and feature sizes have continued to be reduced, the inherent disadvantages of polysilicon have received increased attention. When compared to a metal material, polysilicon has a relatively high resistivity. In a very small MOS device, or in a very high-speed application, the gate resistance, even of heavily doped polysilicon, can adversely limit the device performance. In addition, polysilicon inherently causes a depletion effect that must be compensated for using the threshold implant. This depletion effect further limits the application of polysilicon for the gate terminal material in very low supply voltage products.

The are several approaches in the art to improving the performance of the MOS transistor device by altering or replacing the polysilicon material. One approach is to replace the polysilicon layer with a metal layer as is shown in the process sequence illustrated in FIGS. 1 through 4. Referring specifically to FIG. 1, a partially completed integrated circuit device is shown in a cross sectional representation. The device comprises, at this point in the fabrication process, a semiconductor substrate 10 onto which are formed a series of temporary gates. Each gate is formed by a patterned polysilicon layer 18 overlying the substrate 10 with a dielectric layer 14 therebetween. Further processing has been performed to form source and drain regions 22. Spacers 26 have been formed as part of the lightly doped drain (LDD) and heavily doped source/drain system as is well-known in the art. A masking or capping layer 30 is formed overlying each polysilicon gate 18. An isolation layer 34 is formed overlying the substrate 10 and electrically isolating each gate.

At this stage in the process, the cross-section shows typical MOS devices with polysilicon gates 18. However, in this case, the gates 18 are temporary and serve to form the boundaries for permanent metal gates that will be formed by a damascene process. Referring now to FIG. 2, the capping layer 30, polysilicon layer 18, and dielectric layer 14 are completely removed to reveal gate openings 38. Referring now to FIG. 3, these openings are then filled by, first, forming a new dielectric layer 42 on the surface of the substrate 10 in the gate openings. Next, a metal layer 46, is deposited to fill the gate openings. Finally, referring now to FIG. 4, the metal layer 46 is polished down to remove the excess metal 46 between the gates and to thereby confine the metal layer 46 to the gate openings. The resulting metal gates 46 exhibit improved performance over the polysilicon gates, especially in dramatically reduced gate resistance. However, the process requires that the gate dielectric layer be re-formed and requires a polishing operation.

Several prior art inventions relate to silicide gate methods and devices. U.S. Pat. No. 6,465,309 B1 to Xiang et al describes a method to form a silicide gate transistor. An amorphous silicon layer is deposited following complete removal of a temporary polysilicon gate. U.S. Pat. No. 6,475,908 B1 to Lin et al describes a method to form metal silicide gate MOS transistors. In one embodiment, a temporary gate is formed and then removed. A metal/oxide gate is then formed in the opening. The metal is converted to silicide by ion implantation of silicon ions and thermal processing. U.S. Pat. No. 6,528,402 B2 to Tseng describes a method to form a self-aligned, silicide gate. A polysilicon gate is partially converted to metal silicide.

SUMMARY OF THE INVENTION

A principal object of the present invention is to provide an effective and very manufacturable method to form a metal silicide gate MOS device.

A further object of the present invention is to provide a metal silicide gate MOS process that does not require re-forming the gate dielectric.

A yet further object of the present invention is to provide a metal silicide gate MOS process that follows the damascene metal interconnect process.

A yet further object of the present invention is to provide a metal silicide gate MOS process that is easily compatible with a dual thickness, gate oxide process.

A yet further object of the present invention is to provide a metal silicide gate MOS process that does not require a metal polishing process.

A yet further object of the present invention is to provide a metal silicide gate MOS process that allows the threshold implant to easily adjust the voltage threshold for CMOS devices, even in very low voltage systems.

Another further object of the present invention is to provide a metal silicide gate MOS device with improved performance.

In accordance with the objects of this invention, a method to form metal silicide gates in the fabrication of an integrated circuit device is achieved. The method comprises forming polysilicon lines overlying a substrate with a dielectric layer therebetween. A first isolation layer is formed overlying the substrate and the sidewalls of the polysilicon lines. The first isolation layer does not overlie the top surface of the polysilicon lines. The polysilicon lines are partially etched down such that the top surfaces of the polysilicon lines are below the top surface of the first isolation layer. A metal layer is deposited overlying the polysilicon lines. A thermal anneal is used to completely convert the polysilicon lines to metal silicide gates. The unreacted metal layer is removed to complete the device.

Also in accordance with the objects of this invention, a metal silicide gate MOS device is achieved. The device comprises a metal silicide gate overlying a substrate with a dielectric layer therebetween. Spacers are on the sidewalls of the metal silicide gate. The spacers are substantially taller than the metal silicide gate.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a metal silicide gate MOS device in the manufacture of an integrated circuit device. A polysilicon gate is partially etched away and, then, is converted to metal silicide. It should be clear to those experienced in the art that the present invention can be applied and extended without deviating from the scope of the present invention.

Figure 1:
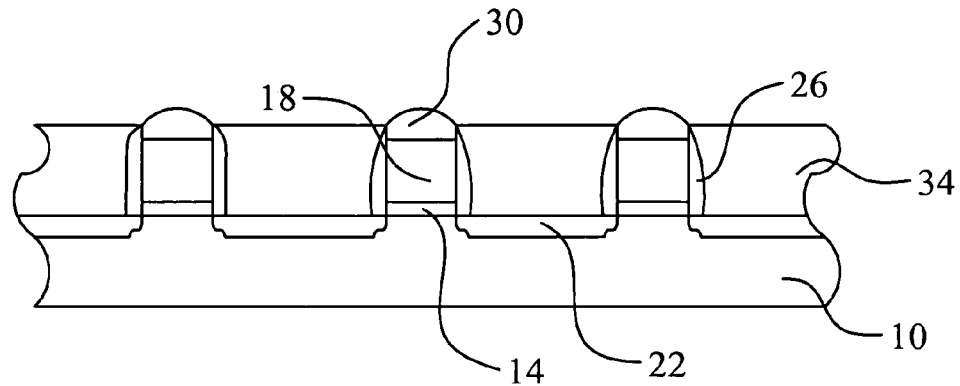
FIGS. 1 through 4 illustrate a prior art method of forming a metal gate MOS device.
Figure 2:
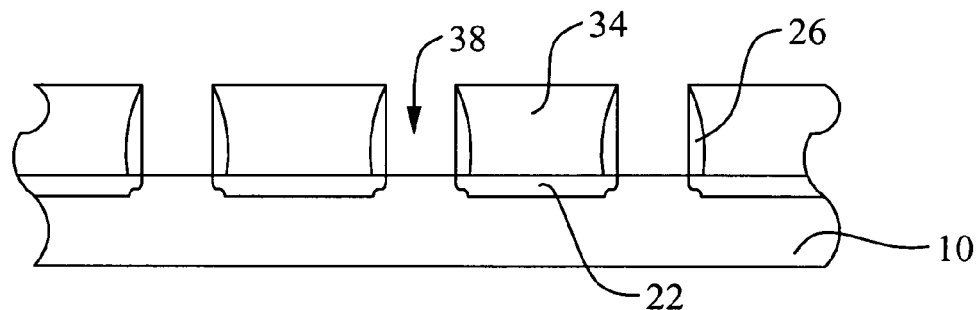
Figure 3:
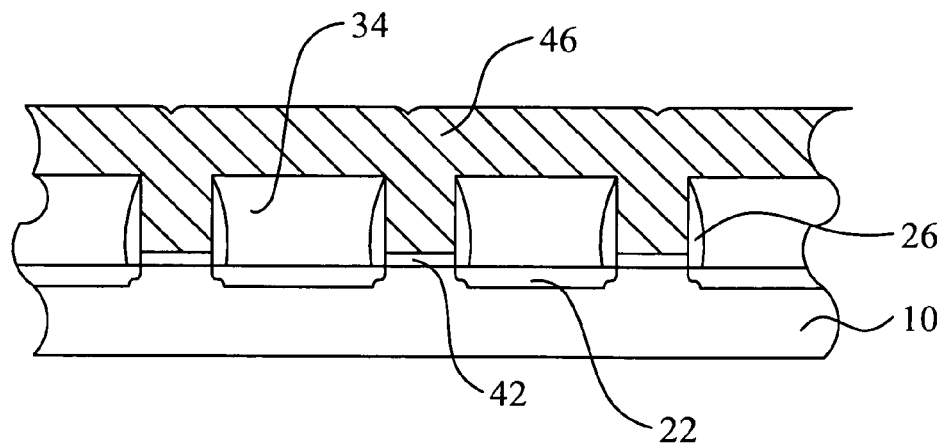
Figure 4:
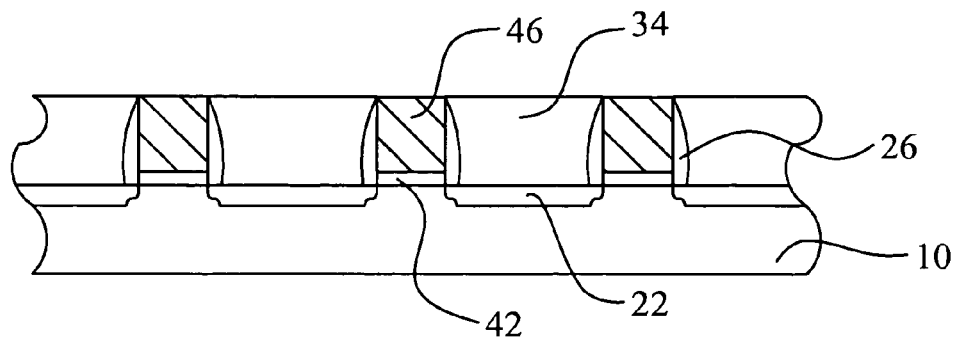
Figure 5:
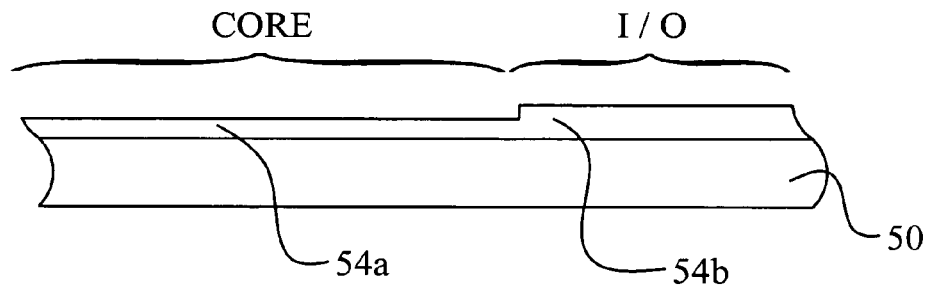
FIGS. 5 through 18 illustrate a preferred embodiment of the present invention.

FIGS. 5 through 18 illustrate a preferred embodiment of the present invention. Several important features of the present invention are shown and discussed below. Referring particularly to FIG. 5, a cross-section of a partially completed integrated circuit device is illustrated. A substrate 50 is provided. The substrate 50 preferably comprises a semiconductor material and, more preferably, comprises monocrystalline silicon as is well-known in the art. The semiconductor material 50 may further be doped with impurity ions such that the resulting substrate is n-type or p-type.

A dielectric layer 54*a* and 54*b* is formed overlying the substrate 50. The dielectric layer 54*a* and 54*b* comprises an insulator material. Preferably, an oxide is used for the dielectric. Most preferably, the dielectric layer 54*a* and 54*b* comprises silicon oxide that is grown overlying a silicon substrate 50 by a thermal process. Alternatively, a silicon oxide layer 54*a* and 54*b* may be deposited by a chemical vapor deposition (CVD) process using a precursor. Other insulators, such as metal oxides or metal nitride oxides, could also be used. In the particular illustration, the dielectric layer 54*a* and 54*b* is shown to possess two thicknesses. Where an integrated circuit device is formed having an especially thin gate dielectric layer 54*a* in the core logic/processing circuits, it is sometimes advantages to form a thicker dielectric layer 54*b* in the input/output (I/O) sections. In this way, very high speed MOS transistors can be formed in the CORE using the thinner dielectric 54*a* while higher voltage capable MOS transistors can be formed in the I/O using the thicker dielectric 54*b*. Many schemes have been proposed to form multiple thickness gate dielectrics in the art. The use of multiple dielectric thickness is given as an example of a useful application of the present invention but is not a critical or necessary component of the present invention.

Figure 6:
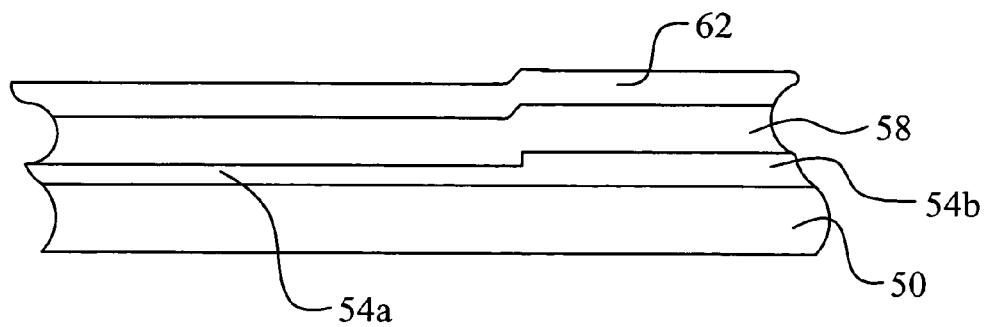

Referring now to FIG. 6, a polysilicon layer 58 is formed overlying the dielectric layer 54*a* and 54*b*. The polysilicon layer 58 is preferably formed by CVD or by low-pressure CVD. The polysilicon layer 58 preferably has a thickness of between about 200 Å and about 5,000 Å. The polysilicon layer 58 is important because the polysilicon 58 is partially etched down prior to conversion to metal silicide. Hence, the polysilicon layer 58 must be made thick enough to not be etched through by this later etching step. The polysilicon layer 58 may be formed doped or undoped though the later, complete conversion to metal silicide will cause any doping effect to be moot in establishing the gate resistance.

A hard mask layer 62 is deposited overlying the polysilicon layer 58. The hard mask layer 62 is used for patterning the polysilicon 58 and for protecting the top surface of the polysilicon 58 during subsequent processing. The hard mask layer 62 comprises a material that can be selectively etched with respect to the polysilicon layer 58. Preferably, silicon nitride is deposited by a CVD process to form the hard mask layer 62. The hard mask layer 62 is preferably formed to a thickness of between about 100 Å and about 1,000 Å.

Figure 7:
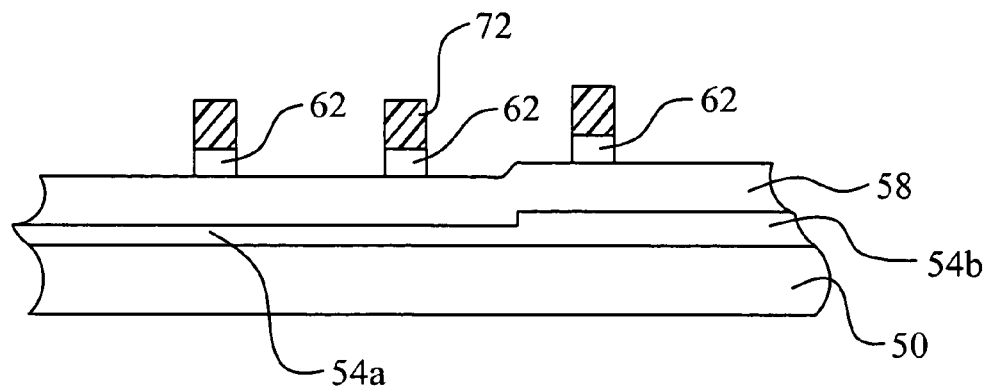

Referring now to FIG. 7, the hard mask layer 62 is patterned. This patterning step is preferably performed using a patterned photoresist layer 72. For example, a photoresist layer 72 may be applied overlying the hard mask layer 62. The photoresist layer 72 is then exposed to actinic light through a mask to cause part of the photoresist polymer 72 to become cross-linked while part remains non-cross-linked. The photoresist 72 is then developed to cause part of the photoresist 72 to be washed away while part remains as the transferred pattern of the mask. The hard mask layer 62 is etched using the patterned photoresist layer 72 as a mask such that the pattern is transferred to the hard mask layer. The etching step may be performed using a wet chemical or dry chemical etch as is well-known in the art. The photoresist layer 72 is stripped away after the hard mask etch.

Figure 8:
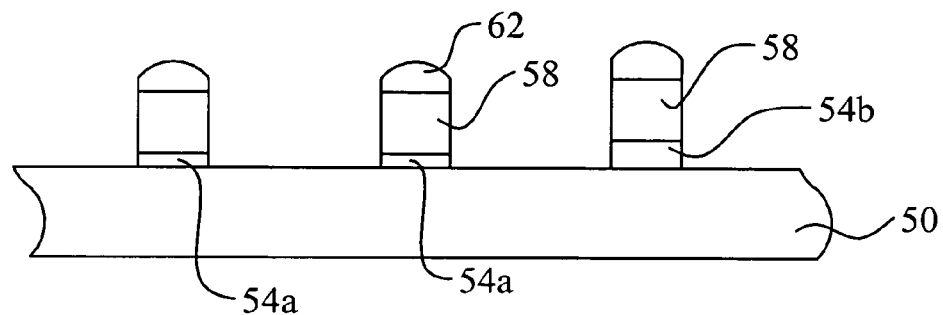

Referring now to FIG. 8, an important feature of the present invention is illustrated. The polysilicon layer 58 is patterned to form the gates for the planned MOS devices. The patterned hard mask layer 62 is used to mask the etching process such that the pattern is transferred from the hard mask layer 62 to the polysilicon layer 58. A wet or dry etching process may be used, though it is preferred that the polysilicon layer 58 is etched using a dry etch such as a reactive ion etch (RIE) as is known in the art. The etching process may remove a part of the hard mask layer 62 to cause the rounded shape as seen.

Figure 9:
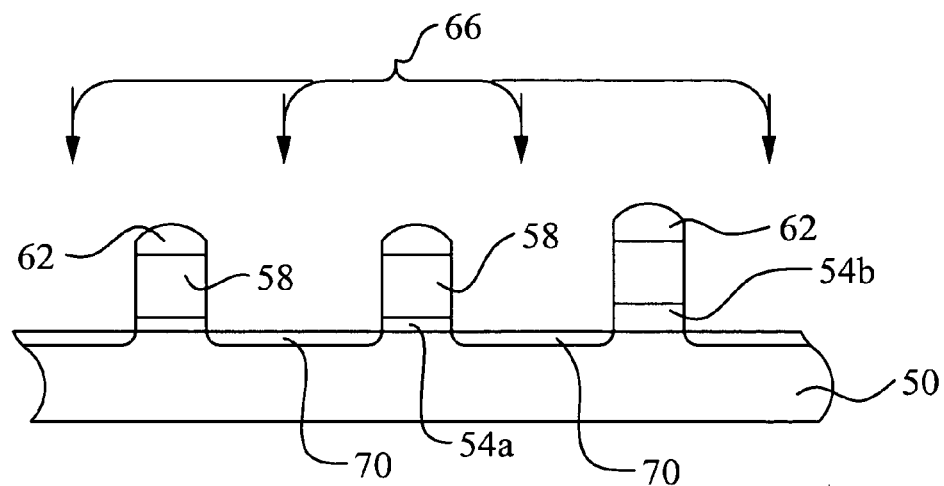

Referring now to FIG. 9, ions are implanted 66 to form first doped regions 70 in the substrate 50. The patterned polysilicon lines 58 block the implantation of ions into the substrate 50 under these lines 58. In this way, the first doped regions 70 are formed adjacent to, or self-aligned to, the polysilicon lines 58. The first doped regions 70 preferably are lightly doped to the opposite type of the substrate 50 and correspond to lightly doped drains (LDD) as are well-known in the art.

Figure 10:
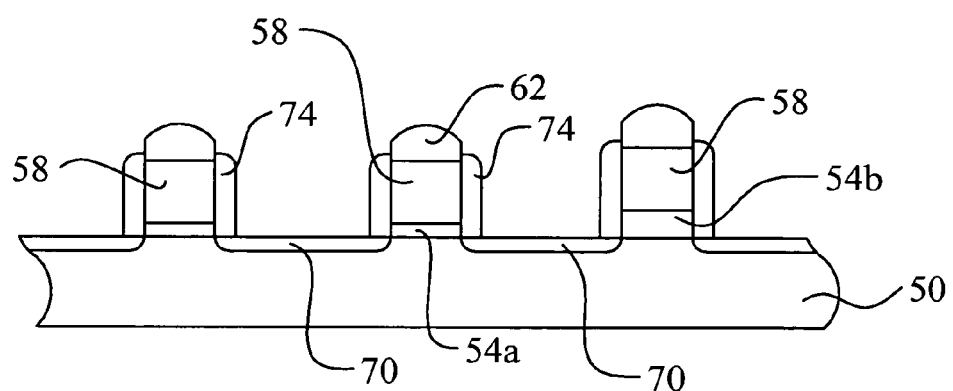

Referring now to FIG. 10, spacers 74 are then formed on the sidewalls of the polysilicon lines 58. The spacers 74 comprise an insulator material, such as oxide or nitride. Preferably, the spacers 74 comprise silicon nitride. The spacers 74 may be formed, for example, by depositing the spacer film overlying the substrate 50 and the polysilicon lines 58. An anisotropic etch is then performed to etch the spacers in the vertical direction until the spacer film is removed from the horizontal surfaces leaving the spacers 74 adjacent to the edges of the polysilicon lines 58. The resulting spacers 74 have a width of between about 200 Å and about 1000 Å.

Figure 11:
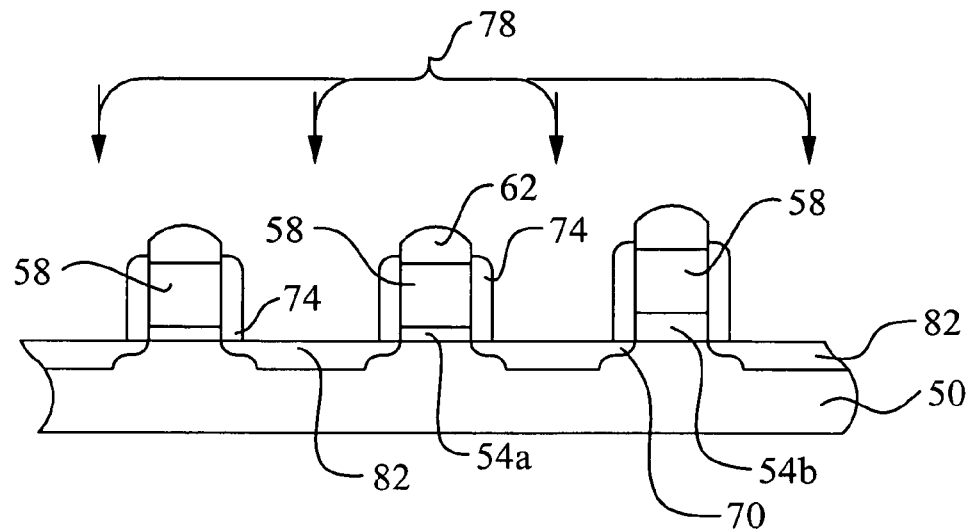

Referring now to FIG. 11, a second ion implantation 78 is performed. Ions are implanted 78 into the substrate 50 in the areas not blocked by the polysilicon lines 58 or the spacers 74. In this way, second doped regions 82 are formed adjacent to, or self-aligned to, the spacers 74. These second doped regions 82 correspond to source/drain regions and are preferably heavily doped to the opposite type of the substrate 50.

Figure 12:
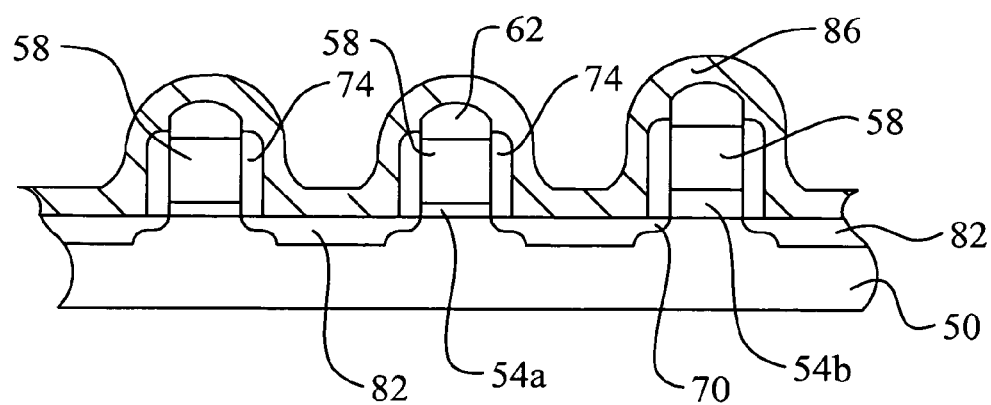
Figure 13:
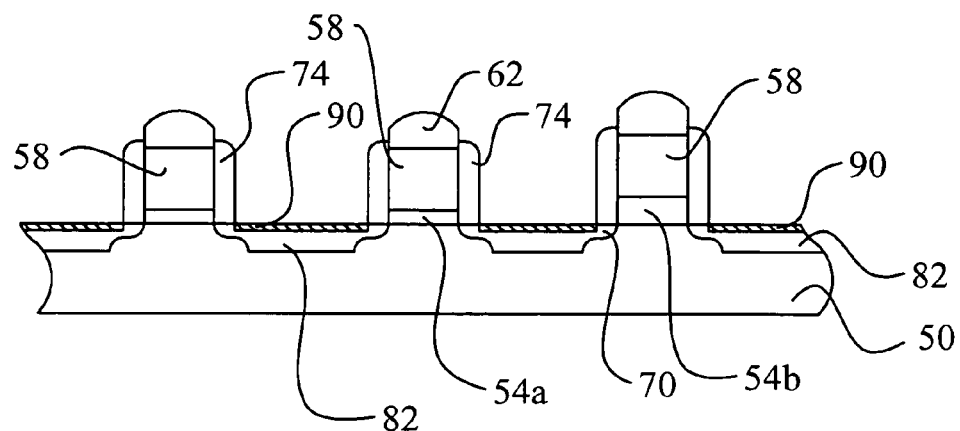

Referring now to FIGS. 12 and 13, another important feature of the present invention is illustrated. To reduce the source/drain 82 resistance, a metal silicide layer 90 may be formed on the second heavily doped (source/drain) regions 82. Referring particularly to FIG. 12, a metal layer 86 is formed overlying the substrate 50. The metal layer 86 preferably comprises a metal that is reactive with silicon such as cobalt, nickel, or titanium. A thermal anneal is then performed to greatly increase the reaction rate between the silicon of the substrate 50 and the metal layer 86. The reaction product is metal silicide ($MSi_x$) as is well-known in the art. Referring particularly to FIG. 13, the metal silicide layer 90 only forms on the exposed substrate 50 because the spacers 74 and hard mask layer 62 protect the polysilicon lines 58 from exposure to the reactive metal 86. The unreacted metal 86 is removed. At this point in the process, the polysilicon lines 58 have been used as place holders to align the formation of the source/drain regions 82, the LDD regions 70, the metal silicide regions 90, and the spacers 74.

Figure 14:
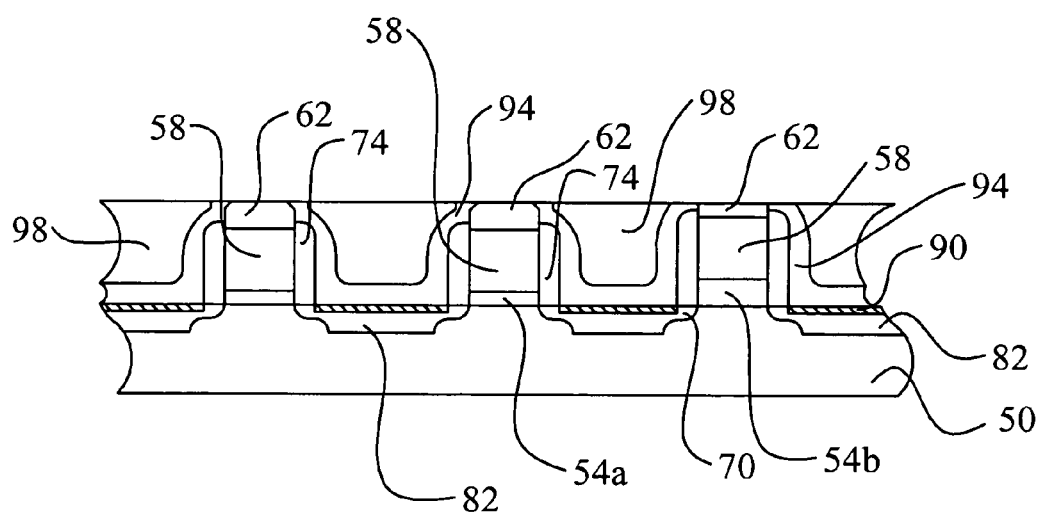

Referring now to FIG. 14, a first isolation layer 98 is formed overlying the substrate 50 and providing an isolation between the polysilicon lines 58. Prior to the deposition of the first isolation layer 98, a contact stop layer 94 may be formed overlying the substrate 50, the spacers 74, and the hard mask layer 62. The contact stop layer 94 is used to provide an etch stop for the subsequent contact opening etch used in the metal interconnect processing. Preferably, the contact stop layer 94 comprises silicon nitride. The first isolation layer 98 preferably comprises an oxide layer, such as silicon oxide, that is deposited using a CVD process. Alternatively, spin-on glass or organic-based, low-k dielectrics could be used. The first isolation layer 98 is preferably formed to a substantial thickness such that the gaps between the polysilicon lines 58 are filled. The first isolation layer 98 may then be planarized to remove excess first isolation material 98 such that the isolation layer 98 is confined to the gaps between the lines 98. A polishing operation, such as a chemical mechanical polish (CMP), may be used. The hard mask layer 62 protects the top surfaces of the polysilicon lines 58 from the planarization process and may act as a stopping mechanism for the planarization process as is well-known in the art.

Figure 15:
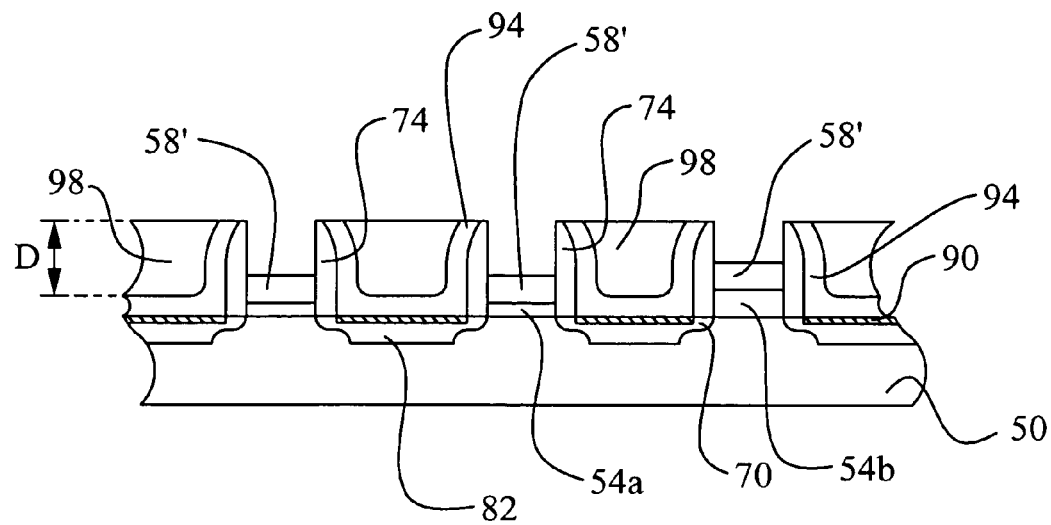

Referring now to FIG. 15, an important feature of the present invention is illustrated. The polysilicon lines 58 are partially etched down such that the top surfaces of the resulting polysilicon lines 58' are below the top surface of the first isolation layer 98. The hard mask layer 62 is first removed by etching away. Then the polysilicon layer 58' is partially etched down. It is preferred that a dry etching process, selective to polysilicon, is used to etch the polysilicon down. In the preferred embodiment, the resulting polysilicon lines 58' are below the top surface of the first isolation layer by a distance D of between about 300 Å and about 1,000 Å. Alternatively, the remaining polysilicon lines 58' have a thickness of between about 100 Å and about 500 Å. Most importantly, the resulting polysilicon lines 58' cover and protect the dielectric layer 54a and 54b and are thin enough so that the subsequent silicide process will completely convert the lines to metal silicide.

Figure 16:
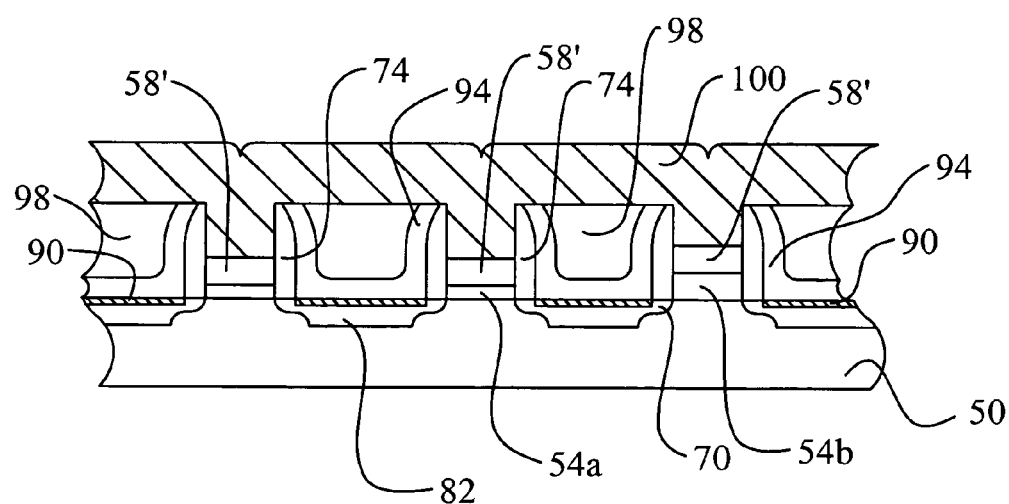
Figure 17:
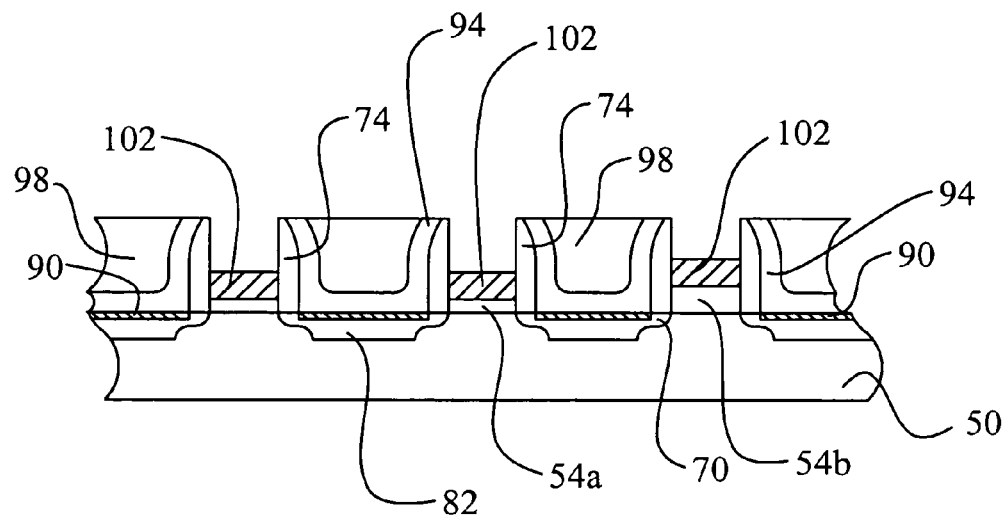

Referring now to FIG. 16, another important feature of the present invention is illustrated. A metal layer 100 is deposited overlying the remaining polysilicon lines 58' and the first isolation layer 98. The metal layer 100 comprises a metal that will react with the polysilicon layer 58' to form metal silicide. Preferably, the metal layer 100 comprises cobalt or nickel and is deposited by physical vapor deposition (PVD). A thermal annealing operation is then performed to catalyze the reaction of the metal layer 100 and the polysilicon layer 58'. For example, the entire device can be thermally treated at a temperature of between about 150° C. and about 800° C. for between about 0.5 minutes and about 10 minutes. This treatment will cause the complete conversion of the polysilicon layer 58' into a metal silicide ($MSi_x$) layer 102 as shown in FIG. 17. The non-reacted metal layer 100 is then removed to complete the metal silicide gate 102 device. The resulting metal silicide gate electrodes 102 have a thickness of between about 100 Å and about 900 Å.

Figure 18:
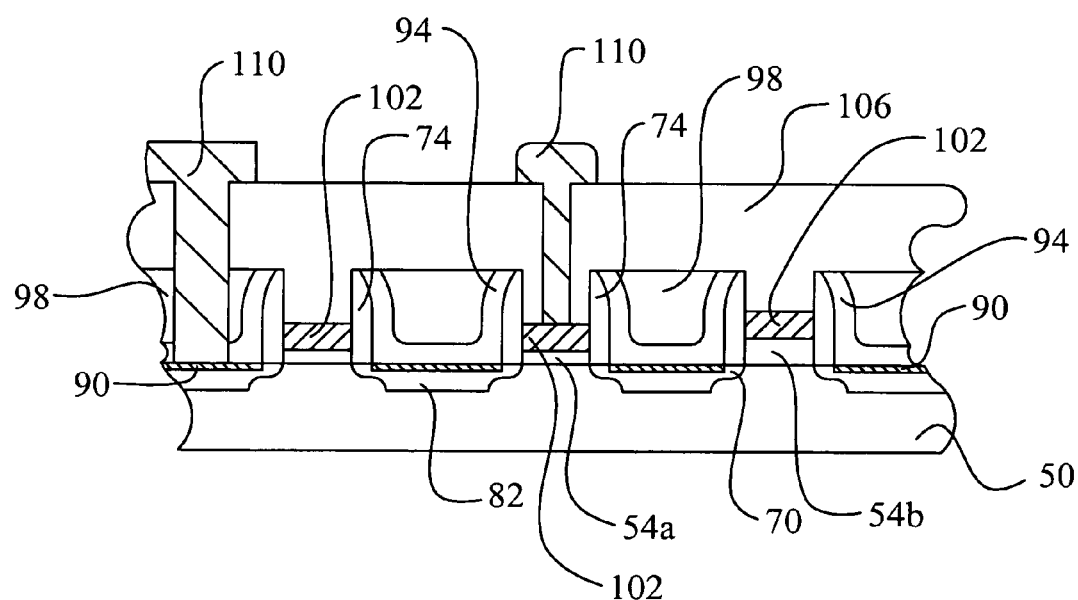

Referring now to FIG. 18, the device may be further processed by depositing a second isolation layer 106 overlying the metal silicide gates 102 and the first isolation layer 98. Contact openings are then patterned into the second isolation layer 106. Another metal layer 110 is then deposited to fill the contact openings and patterned to form interconnecting lines.

Referring again to FIG. 17, the novel metal silicide gate MOS device may now be described. The device comprises a metal silicide gate 102 overlying a substrate 50 with a dielectric layer 54a and 54b therebetween. Spacers 74 are on the sidewalls of the metal silicide gate 102. The spacers 74 are substantially taller than the metal silicide gate 102. The device may further comprise source and drain regions 82 and lightly doped drain regions (LDD) 70. Metal silicide regions 90 may further be formed in the substrate 50 at the source and drain regions 82.

The advantages of the present invention may now be summarized. An effective and very manufacturable method to form a metal silicide gate MOS device is achieved. The metal silicide gate MOS process does not require re-forming the gate dielectric. The metal silicide gate MOS process follows the damascene metal interconnect process. The metal silicide gate MOS process is easily compatible with a dual thickness, gate oxide process. The metal silicide gate MOS process does not require a metal polishing process. The metal silicide gate MOS process allows the threshold implant to easily adjust the voltage threshold for CMOS devices, even in very low voltage systems. The resulting metal silicide gate MOS device has improved performance by lowering the gate resistance.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form metal silicide gates in the fabrication of an integrated circuit device, said method comprising:

forming polysilicon lines overlying a substrate wherein said polysilicon lines have dielectric sidewalls;

forming a first isolation layer overlying said substrate and said dielectric sidewalls wherein said first isolation layer does not overlie the top surface of said polysilicon lines;

partially etching down said polysilicon lines such that said top surfaces of said polysilicon lines are below the top surface of said dielectric sidewalls;

thereafter depositing a metal layer overlying said polysilicon lines;

thermally annealing to completely convert said polysilicon lines to metal silicide gates; and removing unreacted said metal layer to complete said device;

wherein said polysilicon lines are covered by a hard mask layer prior to said step of partially etching down said polysilicon lines and further comprising:

depositing a second metal layer overlying said substrate, said spacers, and said hard mask layer prior to said step of partially etching down said polysilicon lines;

thermally annealing to convert a part of said substrate in said second doped regions to metal silicide; and removing unreacted said second metal layer.

2. The method according to claim 1 wherein said step of forming polysilicon lines further comprises:
   forming a dielectric layer overlying said substrate;
   depositing said polysilicon layer overlying said dielectric layer;
   depositing a hard mask layer overlying said polysilicon layer;
   patterning said hard mask layer; and
   patterning said polysilicon layer to form said polysilicon lines as defined by said hard mask layer pattern.

3. The method according to claim 2 wherein said hard mask layer is removed prior to said step of partially etching down said polysilicon lines.

4. A method to form metal silicide gates in the fabrication of an integrated circuit device, said method comprising:
   forming polysilicon lines overlying a substrate wherein said polysilicon lines have dielectric sidewalls;
   forming a first isolation layer overlying said substrate and said dielectric sidewalls wherein said first isolation layer does not overlie the top surface of said polysilicon lines;
   partially etching down said polysilicon lines such that said top surfaces of said polysilicon lines are below the top surface of said dielectric sidewalls;
   thereafter depositing a metal layer overlying said polysilicon lines;
   thermally annealing to completely convert said polysilicon lines to metal suicide gates; and
   removing unreacted said metal layer to complete said device;
   wherein a dielectric layer between said substrate and a first group of said metal suicide gates has a first thickness, wherein a dielectric layer between said substrate and a second group of said metal silicide gates has a second thickness, and wherein said first and second thicknesses are not equal.

5. The method according to claim 4 wherein said step of forming a first isolation layer further comprises:
   depositing an interlevel dielectric layer overlying said substrate and said polysilicon lines; and
   planarizing said interlevel dielectric layer.

6. The method according to claim 4 further comprising implanting ions into said substrate prior to said step of forming a first isolation layer to thereby form first doped regions in said substrate and adjacent to said polysilicon lines.

7. The method according to claim 4 further comprising:
   depositing a spacer layer overlying said substrate and said polysilicon lines;
   etching back said spacer layer to form spacers on said sidewalls of said polysilicon lines; and
   implanting ions into said substrate to thereby form second doped regions in said substrate and adjacent to said spacers.

8. The method according to claim 7 wherein said spacers have a width of between about 200 Å and about 1000 Å.

9. The method according to claim 4 wherein said step of partially etching down said polysilicon lines results in a thickness of said polysilicon lines of between about 100 Å and about 500 Å.

10. The method according to claim 4 wherein said metal suicide gates have a thickness of between about 180 Å and about 900 Å.

11. A method to form metal suicide gates in the fabrication of an integrated circuit device, said method comprising:
   forming a dielectric layer overlying a substrate;
   depositing a polysilicon layer overlying said dielectric layer;
   depositing a hard mask layer overlying said polysilicon layer;
   patterning said hard mask layer;
   patterning said polysilicon layer to form polysilicon lines as defined by said hard mask layer pattern;
   forming a first isolation layer overlying said substrate and said polysilicon lines wherein said first isolation layer does not overlie said hard mask layer;
   removing said hard mask layer;
   thereafter partially etching down said polysilicon lines such that the top surfaces of said polysilicon lines are below the top surface of said first isolation layer;
   thereafter depositing a metal layer overlying said polysilicon lines;
   thermally annealing to completely convert said polysilicon lines to metal silicide gates; and
   removing unreacted said metal layer to complete said device;
   implanting ions into said substrate prior to said step of forming a first isolation layer to thereby form first doped regions in said substrate and adjacent to said polysilicon lines, wherein said step of forming a first isolation layer further comprises: depositing a spacer layer overlying said substrate and said substrate and said polysilicon lines, etching back said spacer layer to form spacers on said sidewalls of said polysilicon lines, and implanting ions into said substrate to thereby form second doped regions in said substrate and adjacent to said spacers;
   depositing a second metal layer overlying said substrate, said spacers, and said hard mask layer;
   thermally annealing to convert a part of said substrate in said second doped regions to metal suicide; and
   removing unreacted said second metal layer.

12. A method to form metal silicide gates in the fabrication of an integrated circuit device, said method comprising:
   forming a dielectric layer overlying a substrate;
   depositing a polysilicon layer overlying said dielectric layer;
   depositing a hard mask layer overlying said polysilicon layer;
   patterning said hard mask layer;
   patterning said polysilicon layer to form polysilicon lines as defined by said hard mask layer pattern;
   forming a first isolation layer overlying said substrate and said polysilicon lines wherein said first isolation layer does not overlie said hard mask layer;
   removing said hard mask layer;
   thereafter partially etching down said polysilicon lines such that the top surfaces of said polysilicon lines are below the top surface of said first isolation layer;
   thereafter depositing a metal layer overlying said polysilicon lines;
   thermally annealing to completely convert said polysilicon lines to metal suicide gates; and
   removing unreacted said metal layer to complete said device.
   wherein said dielectric layer for a first group of said metal silicide gates is a first thickness, wherein said dielectric layer for a second group of said metal silicide gates is a second thickness, and wherein said first and second thicknesses are not equal.

13. The method according to claim 12 wherein said step of forming a first isolation layer further comprises:
depositing an interlevel dielectric layer overlying said substrate and said polysilicon lines; and planarizing said interlevel dielectric layer.

14. The method according to claim 12 wherein said step of forming a first isolation layer further comprises:
depositing a spacer layer overlying said substrate and said polysilicon lines; and
etching back said spacer layer to form spacers on said sidewalls of said polysilicon lines.

15. The method according to claim 12 further comprising implanting ions into said substrate prior to said step of forming a first isolation layer to thereby form first doped regions in said substrate and adjacent to said polysilicon lines.

16. The method according to claim 12 wherein said step of forming a first isolation layer further comprises:
depositing a spacer layer overlying said substrate and said substrate and said polysilicon lines;
etching back said spacer layer to form spacers on said sidewalls of said polysilicon lines; and
implanting ions into said substrate to thereby form second doped regions in said substrate and adjacent to said spacers.

17. The method according to claim 12 wherein said step of partially etching down said polysilicon lines results in a thickness of said polysilicon lines of between about 100 Å and about 500 Å.

18. The method according to claim 12 wherein said metal suicide gates have a thickness of between about 180 Å and about 900 Å.

* * * * *